United States Patent
Rohleder et al.

(10) Patent No.: US 11,595,027 B2
(45) Date of Patent: Feb. 28, 2023

(54) HIGH FREQUENCY PULSE WIDTH MODULATION SHAPING

(71) Applicant: NXP USA, Inc., Austin, TX (US)

(72) Inventors: Michael Rohleder, Unterschleissheim (DE); Vaclav Halbich, Austin, TX (US); Lukas Vaculik, Valasske Mezirici (CZ); Petr Špaček, Ostrava—Stará Bělá (CZ)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/188,801

(22) Filed: Mar. 1, 2021

(65) Prior Publication Data
US 2022/0278673 A1 Sep. 1, 2022

(51) Int. Cl.
| | |
|---|---|
| H03K 3/017 | (2006.01) |
| H02J 7/02 | (2016.01) |
| H03K 3/037 | (2006.01) |
| H03K 19/20 | (2006.01) |
| H02J 50/10 | (2016.01) |

(52) U.S. Cl.
CPC .............. H03K 3/017 (2013.01); H02J 7/02 (2013.01); H03K 3/037 (2013.01); H03K 19/20 (2013.01); H02J 50/10 (2016.02)

(58) Field of Classification Search
CPC ......... H03K 3/017; H03K 3/037; H03K 19/20
See application file for complete search history.

(56) References Cited

U.S. PATENT DOCUMENTS

| | | | |
|---|---|---|---|
| 5,812,427 A | * | 9/1998 | Nonoyama ........... G01P 15/124 700/28 |
| 6,421,382 B1 | | 7/2002 | Hayakawa |
| 6,436,299 B1 | | 8/2002 | Baarman et al. |
| 6,526,094 B1 | | 2/2003 | Watanabe |
| 7,079,577 B2 | | 7/2006 | Cohen |
| 8,185,064 B2 | | 5/2012 | Nogami et al. |
| 8,315,302 B2 | | 11/2012 | Lewis |
| 8,873,616 B2 | | 10/2014 | Garbutt et al. |

(Continued)

FOREIGN PATENT DOCUMENTS

WO WO2010036980 A1 9/2009

OTHER PUBLICATIONS

Xiang Gao, "Demodulating Communication Signals of Qi-Compliant Low-Power Wireless Charger Using MC56F8006 DSC," Freescale Semiconductor Inc., Application Note, Document No. AN4701, Rev. 0, 21 pages, Mar. 2013.

(Continued)

*Primary Examiner* — Sibin Chen

(57) ABSTRACT

Duty cycles of pulse width modulation ("PWM") pulses are determined by measurements taken with respect to an internally generated clock signal. One of these measurements calculates, in a continuous dynamic manner, a ratio of the number of cycles of the internally generated clock signal to one or more cycles of a PWM clock signal utilized as a time base for generation of the PWM pulses. This clock ratio measurement designates how many cycles of the internally generated clock signal will be used to designate a first portion of a duty cycle for each PWM pulse. Another measurement is utilized to determine a fractional portion of a cycle of the internally generated clock signal that will be used to designate a second portion of the duty cycle for each PWM pulse.

20 Claims, 9 Drawing Sheets

(56) References Cited

U.S. PATENT DOCUMENTS

| | | | |
|---|---|---|---|
| 11,108,324 B1 | 8/2021 | Vaculik et al. | |
| 2002/0136290 A1 | 9/2002 | Houghton | |
| 2012/0011088 A1* | 1/2012 | Aparin | G06N 3/06 |
| | | | 706/33 |
| 2015/0171843 A1* | 6/2015 | Kim | H03K 5/06 |
| | | | 327/175 |
| 2016/0111061 A1* | 4/2016 | Thenus | H03K 5/14 |
| | | | 327/284 |
| 2019/0123725 A1* | 4/2019 | Vulpoiu | H03K 7/08 |
| 2019/0305596 A1 | 10/2019 | Mantha et al. | |

OTHER PUBLICATIONS

WCT1011DS Data Sheet, Freescale Semiconductor Inc., Document No. WCT1011DS, Rev. 0, 45 pages, Sep. 2016.

Charlie Wu, "Overview of Wireless Power and Data Communication," Freescale Semiconductor Inc., Wireless Power Consortium, 21 pages, downloaded from www.wirelesspowerconsortium.com on Jan. 12, 2021.

U.S. Appl. No. 17/658,348 "Improved Multiple and Sinusoidal Pulse Width Modulation for Wireless Charging" filed Apr. 7, 2022.

* cited by examiner

HIGH FREQUENCY PULSE WIDTH MODULATION SHAPING

TECHNICAL FIELD

The present disclosure relates in general to pulse width modulation, and in particular, to pulse width modulation utilized for wireless charging applications.

BACKGROUND

Wireless power is becoming more and more popular today, through which a number of electronic items like mobiles, laptops, media players, can be charged without cords or wires. A central issue to be solved for wireless charging is the generation of the signal used for inductive charging, which must follow some of the related standards. As such this signal must not only transfer the wireless power, but also communicate with the device being charged.

Contemporary wireless-charging technology uses near-field charging ("NFC") in which a transmitting coil produces a magnetic field that transfers inductive energy to a nearby receiving coil. A fraction of the magnetic flux generated by the primary transmitter coil penetrates the secondary receiver coil and thus transfers power, i.e., the two coils essentially form a transformer. For example, in a typical wireless charging system, a wireless charging mat wirelessly transmits power to a portable electronic device that is placed on the mat. The portable electronic device has a coil and rectifier circuitry. The coil in the portable electronic device receives alternating-current wireless power signals from a coil in the wireless charging mat that is overlapped by the coil in the portable electronic device. The rectifier circuitry converts the received signals into direct-current power. The wireless power transmitting device has wireless power transmitting circuitry that includes a resonant circuit, an inverter for driving the resonant circuit, and pulse width modulation ("PWM") signal generator that outputs a periodic control signal (a series of PWM pulses) to the inverter at a selected varying duty cycle.

Two of the competing NFC standards are the Qi ("Chee") standard controlled by the Wireless Power Consortium ("WPC"), which has an operating frequency of 100 to 200 kHz, while the AirFuel Alliance, formerly known as the Power Matters Alliance ("PMA"), supports AirFuel Inductive, operating at 100 to 350 kHz. Another standard by Apple, Inc. may operate at even higher frequencies in the future.

Thus, it is desirable that the hardware used for creating this signal (to adhere to existing or coming standards) incorporate the achievable accuracy of the signal being used, but also be implemented in a cost-effective manner.

Traditional implementations of PWM generation capabilities either utilize a very fast clock that can be used to generate the PWM pulses, or a set of delay elements that can be used to specify (a subset) of the required PWM pulse width. However, both implementations have severe limitations. Despite the lower clock speeds of the fundamental frequencies being used by the known standards, this will still require a very fast clock speed (e.g., in the >2 GHz frequency range) for the generation of sufficiently accurate PWM pulse widths. The usage of delay elements has different issues in that typical analog implementations must use a specific delay that will need to be trimmed to compensate for process variations, and may further exhibit a varying temperature and/or voltage dependency during operation. For example, assuming at least a 10-bit accuracy is required for sufficiently accurate PWM pulses in the 2 MHz frequency range, this would require delay elements having at least a 500 picosecond resolution, which will need to be maintained or must be adjusted over variations in temperature and/or voltage during operation.

Another further complexity is the need to be able to produce the PWM pulses in relation to a changing fundamental frequency of the AC signal that is used by the communication aspect of wireless charging. This is especially an issue when using delay elements that cannot scale with changes in the fundamental frequency, when this would be required.

DETAILED DESCRIPTION

Embodiments of the present disclosure utilize measurements taken with respect to an internally generated clock signal for determining the individual duty cycles of pulse width modulation ("PWM") pulses, which may be utilized for producing a signal having a periodic waveform (e.g., a modulated sinewave signal). A PWM clock signal is utilized for the timing of the generation of the PWM pulses. A first measurement is of a ratio of the internally generated clock signal to the PWM clock signal. A second measurement is a ratio of a number of propagation delay elements to a single complete cycle of the internally generated clock signal. These two measurements are then utilized for generation of each duty cycle of the PWM pulses.

Embodiments of the present disclosure provide a fully digital solution for generating PWM pulses with very high accuracy in a cost-efficient implementation. Although embodiments of the present disclosure are disclosed in the context of wireless charging, embodiments of the present disclosure are applicable to other fields of interest using PWM.

Though embodiments of the present disclosure are described herein for outputting PWM pulses for generating an AC signal, such as used for wireless charging, embodiments of the present disclosure may be implemented in any application in which PWM pulses are utilized, including but not limited to, the generation of any signal having a periodic waveform.

Figure 1:
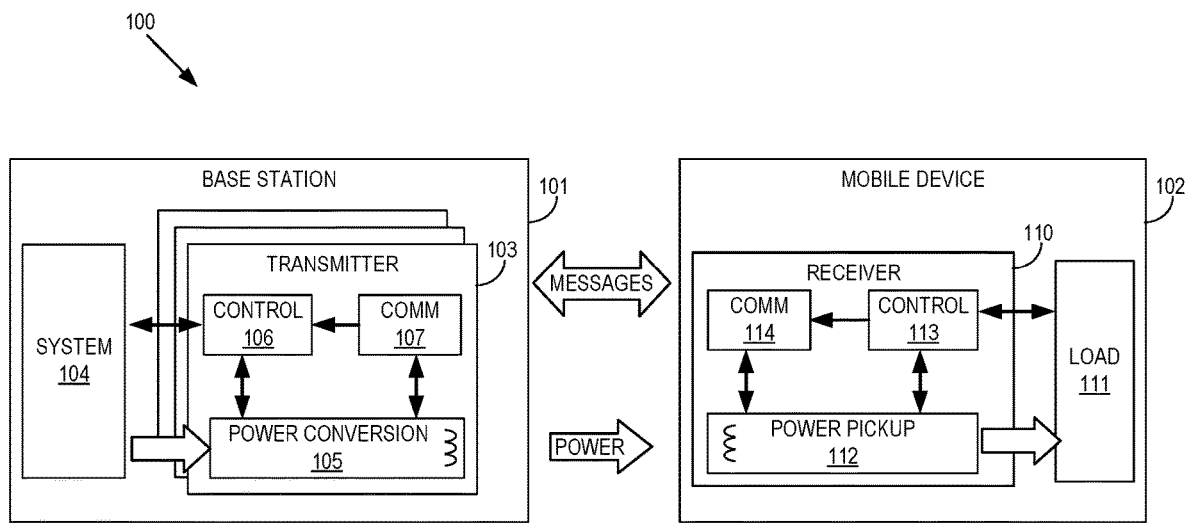
FIG. 1 illustrates an exemplary block diagram of wireless charging of a mobile device in accordance with embodiments of the present disclosure.

Referring to FIG. 1, there is illustrated a non-limiting example of a system 100 configured for wireless charging of a mobile device 102 by a wireless charging transmitter 103 implemented within a wireless charging base station 101. Certain well-known system and circuit elements are not shown for the sake of simplicity. The base station 101 may include one or more wireless charging transmitters 103 for the wireless charging of more than one device. Embodiments of the present disclosure or not limited to the wireless charging of a mobile device such as a mobile phone, but are applicable to the wireless charging of any device. Each of the one or more wireless charging transmitters 103 may be powered by an input direct current ("DC") rail (e.g., 5 V to 19 V), which may be derived from a USB port or an AC/DC power adapter.

Each of the wireless charging transmitters 103 in the base station 101 may be controlled by system circuitry 104, which may be implemented as a microcontroller or some other processing circuitry appropriate for control and operation of such a wireless charging base station 101. Each wireless charging transmitter 103 may include a power conversion circuit 105, which may include appropriate circuitry such as a multiplexer, a full half bridge, etc. for producing an alternating current ("AC") signal from PWM pulses having variable duty cycles for producing the AC signal at a designated (fundamental) frequency, which may also be modified in order to send messages between the transmitter 103 and a receiver 110 of the device 102 been wirelessly charged. The power conversion circuitry 105 may be implemented with a switched transistor bridge using two or four field effect transistors ("FETs") to drive a coil and series capacitor. A resonant frequency is set internally by means of the series capacitor. The power conversion circuitry 105 typically has a coil to transfer power to the mobile device 102 by electromagnetic induction. The power conversion circuitry 105 may support multi-coil arrays, driven by separate bridges, which are automatically selected to deliver the highest coupled power into the wireless charging receiver 110.

Each transmitter 103 may also include control circuitry 106 configured for producing the PWM pulses at the variable duty cycles. The communication circuitry 107 of the transmitter 103 and the communication circuitry 114 of the receiver 110 may be configured in a well-known manner for communicating messages between the transmitter 103 and the receiver 110 by altering the fundamental frequency of the charging AC signal and the responses of the load 111 (note that the double-headed Messages arrow in FIG. 1 is merely a representation of the communication of such messages; a communication channel separate from the charging AC signal is not implemented).

The device 102 being wirelessly charged includes a wireless charging receiver 110, which includes power pickup circuitry 112 for receiving the wireless charging signal from the transmitter 103 and converting it into DC power for charging of a load 111 (e.g., a rechargeable battery or fuel cell). The power pickup circuitry 112 may also include circuitry configured to extract messaging sent from the transmitter 103, which is processed by the communication circuitry 114. The wireless charging receiver 110 may also include control circuitry 113 configured for controlling the power pickup circuitry 112, monitoring of the charging process, and the producing of messaging within the wireless charging receiver 110, which may be communicated to the wireless charging transmitter 103 via responses of the load 111 to the charging AC signal for assisting in its control of the signals being utilized in the wireless charging of the device 102.

The induced power is coupled to the wireless charging receiver 110, which has a similar coil as the transmitter 103 in the power pickup circuitry 112 to collect the incoming power. The power pickup circuitry 112 may rectify the received power by way of diode rectifiers (e.g., utilizing FETs). The power pickup circuitry 112 may also filter the power using ceramic output capacitors, and then apply it to the load 111 that needs to be charged (e.g., either through a linear stage or a switching regulator).

The load 111 inside the mobile device 102 receives the power and charges up. The receiver 110 may be configured to send messages to the transmitter 103 to adjust the charging current or voltage, and also to stop transmitting power completely when end of charge is indicated.

In operation, the receiver 110 may send messages to the transmitter 103 to provide control and device information to the transmitter 103 by load modulation on the received charging signal. The communication circuitry 114 in the receiver 110 may receive messages from the transmitter 103 by demodulation of the frequency modulation on the received power signal. The transmitter 103 may receive messaging from the receiver 110 with respect to power control and device information from the receiver 110 by demodulation of the load modulation. The transmitter 103 may send information regarding the transmitter 103 and/or networking messages to the receiver 110 by frequency modulation on the power signal delivered to the mobile device 102. Such modulation may be implemented with any well-known modulation.

Messaging between the transmitter 103 and the receiver 110 may take the form of any well-known data messaging, such as utilizing bi-phase bit encoding, and byte encoding with a start bit, 8 bits of data, a parity bit, and a stop bit, whereby the data package structure may include a preamble, header, message, and check sum.

Embodiments of the present disclosure are configured to produce each of the PWM pulses for generating an AC signal, which may be utilized for various applications, including, but not limited to, wireless charging (e.g., within the power conversion circuitry 105). As is well-known in the art, such an AC signal is generated by modifying the duty cycles of the PWM pulses.

Figure 2:
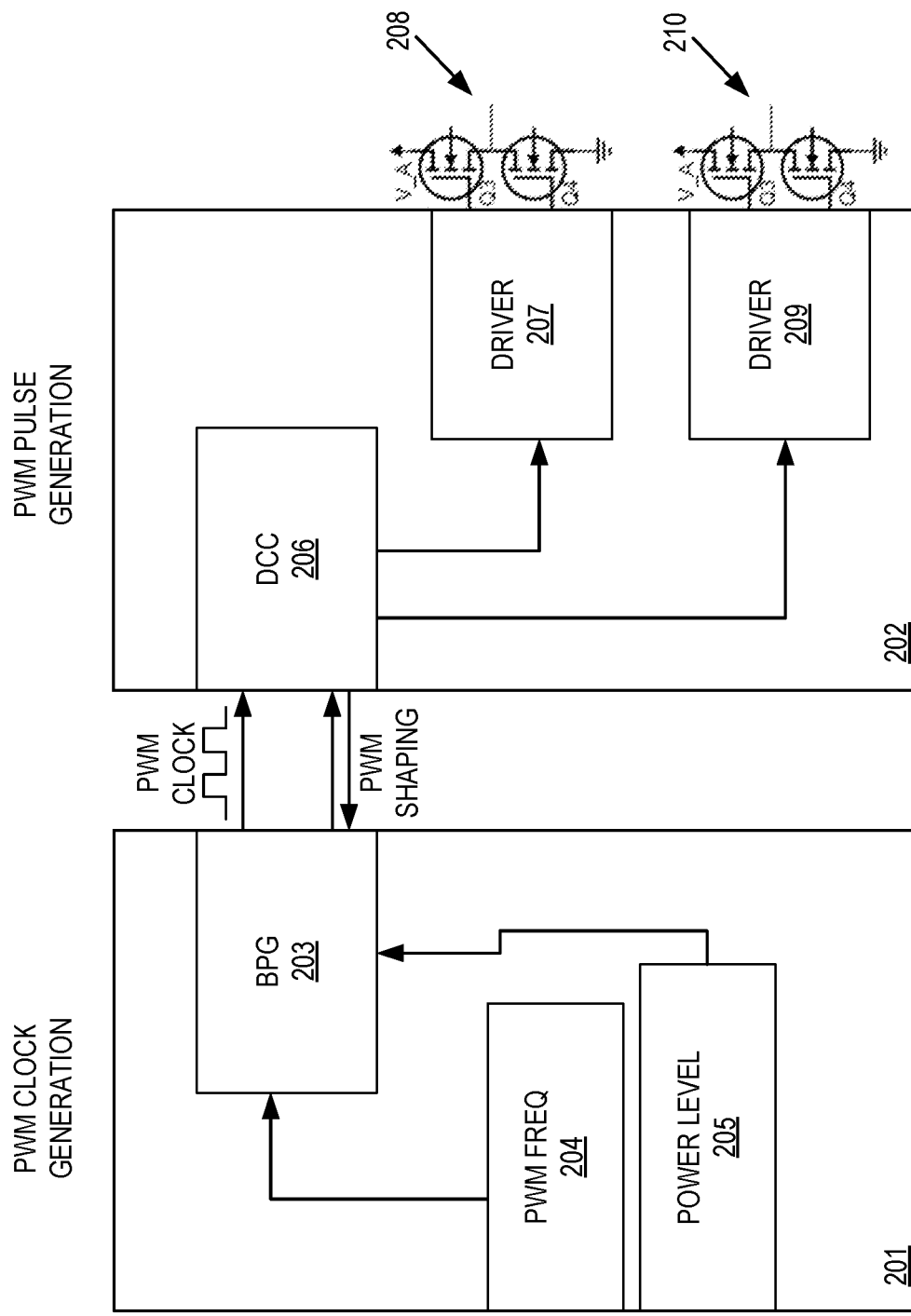
FIG. 2 illustrates a simplified block diagram configured in accordance with embodiments of the present disclosure.

FIG. 2 illustrates a PWM clock generation element 201 coupled to a PWM pulse generation element 202, whereby the PWM clock generation element 201 and the PWM pulse generation element 202 are implemented within the wireless charging base station 101. The PWM clock generation element 201 includes basic PWM clock generation ("BPG") circuitry 203 configured to specify a series of PWM pulses for the generation of the AC signal in which a time base for this generation is in the form of a PWM clock signal having a predetermined frequency, which may be generated by any well-known clock signal generation circuit included in the BPG circuitry 203. The parameters for the generation of the PWM clock signal is derived from the fundamental frequency of the AC signal to be generated from the PWM pulses. For this purpose, the BPG circuitry 203 is configured in a well-known manner with software/hardware 204 to determine the number of PWM pulses for both the left- and right-side drivers 207, 209, and the number of cycles of the PWM clock signal for each generated PWM pulse. These parameters are programmable, and as such part of the PWM shaping information discussed herein. Since the clock signal is an integer multiple of the fundamental frequency of the AC signal multiplied by the number of generated PWM pulses multiplied with the number of PWM clocks per PWM pulse, changes in the fundamental frequency can be managed by altering this PWM clock signal. In accordance with embodiments of the present disclosure, functionality of the BPG circuitry 203 (i.e., determination of the duty cycles for each of the PWM pulses to be generated, which is output as part of the PWM shaping information delivered to the PWM pulse generation element 202) may be implemented in a well-known manner by software executed within the BPG circuitry 203.

Additionally, the BPG circuitry 203 may be configured to provide in a well-known manner PWM shaping information to the PWM pulse generation element 202. Corresponding well-known calculations utilized to specify the power level control as a function of the PWM duty cycle for every individual PWM pulse may be implemented by a software function 205 (e.g., as determined by the control circuitry 106) for each PWM pulse. As will be described with respect to FIG. 9, the software executed within the BPG circuitry 203 is configured to calculate the corresponding PWM shaping information as a function of measurements to be made within the PWM pulse generation element 202 for designating each duty cycle of the PWM pulses to be generated. The result of these calculations is then delivered to the PWM pulse generation element 202 in a well-known manner.

The PWM pulse generation element 202 includes duty cycle control ("DCC") circuitry 206, which receives the time base information specified by the PWM clock signal. As will be further described, the DCC circuitry 206 implements an internally generated clock signal (which may be internally generated within the DCC circuitry 206 as a free-running clock signal), performs measurements pertaining to this clock signal, generates a series of PWM pulses having individual PWM shaping, and forwards these PWM pulses to the driver elements 207, 209 for AC signal generation. In accordance with embodiments of the present disclosure, this internally generated clock signal may be generated in a manner that is independent from the generation of the PWM clock signal, i.e., neither of these clock signals is derived from the other clock signal.

As will be described in further detail, the measurements pertaining to the clock signal generated within the DCC 206 (also referred to herein as the "internal clock," "internal clock signal," or "internally generated clock signal") are delivered to the software running within the BPG circuitry 203 to produce the PWM shaping information using the result of power level calculations 205, which designates the duty cycles for each PWM pulse to be generated within the DCC 206. One of these measurements calculates, in a continuous dynamic manner, a ratio of the number of cycles of the internal clock signal to one or more cycles of the PWM clock signal as produced by the clock signal generation circuit in the BPG circuitry 203 (this measurement is also referred to herein as the "first measurement"). The software within the BPG circuitry 203 will utilize this clock ratio measurement to determine, or designate, how many cycles of the internal clock signal are required to generate a portion of a duty cycle for each of the PWM pulses. This may also be referred to herein as the "PWM inter-clock portion" of the duty cycle. Since an integer number of cycles of the internal clock signal may not be sufficiently accurate to produce, or designate, an entire particular duty cycle of a PWM pulse to be generated (i.e., such a particular duty cycle has a width (as measured in time) that is not exactly equal to an integer number of cycles of the internal clock signal), another measurement (also referred to herein as the "second measurement") is utilized to determine an amount of a portion (less than whole fraction) of a cycle of the internal clock signal required to concatenate to the PWM inter-clock portion to more accurately generate the particular duty cycle of the PWM pulse to be generated. This fractional portion may also be referred to herein as the "PWM intra-clock portion" of the duty cycle. As will be further described with respect to FIG. 5, the additional accuracy provided by this PWM intra-clock portion is a function of the technology utilized to measure it.

As will be further described, embodiments of the present disclosure utilize a concatenation of the PWM inter-clock portion and the PWM intra-clock portion to designate each of the duty cycles of the PWM pulses to be generated.

Though the foregoing measurements are referred to herein as the first measurement and the second measurement, such labels are used merely for identification purposes within the description and the claims, and do not necessarily indicate the relative timing for performing each of these measurements.

Moreover, as further described herein, these measurements are performed on a continuous dynamic basis so that fluctuations in the generation of the internal clock signal (e.g., as resulting from variations in temperature or voltage, or even inherent inaccuracies associated with the circuitry utilized to generate the internal clock signal) are inherently compensated for since such fluctuations will be accounted for within the first and second measurements. As such, embodiments of the present disclosure enable usage of an internal clock signal that is not required to be particularly accurate, and also does not require any trimming to be performed after the initial manufacturing of the integrated circuit. Instead, embodiments of the present disclosure are configured to continuously observe this internal clock signal, and effectively perform an automatic trimming that might result from temperature/voltage variations.

In accordance with embodiments of the present disclosure, the PWM clock generation element 201 may be implemented within a microcontroller, wherein the generated PWM clock signal and the PWM shaping information may be forwarded from such a microcontroller to the PWM pulse generation element 202. Alternatively, the functionalities of the PWM clock generation element 201 and the PWM pulse generation element 202 may be combined within the same microcontroller of other type of integrated circuit. In accordance with certain embodiments of the present disclosure, the DCC circuitry 206 may be implemented as fully digital circuitry.

Figure 3:
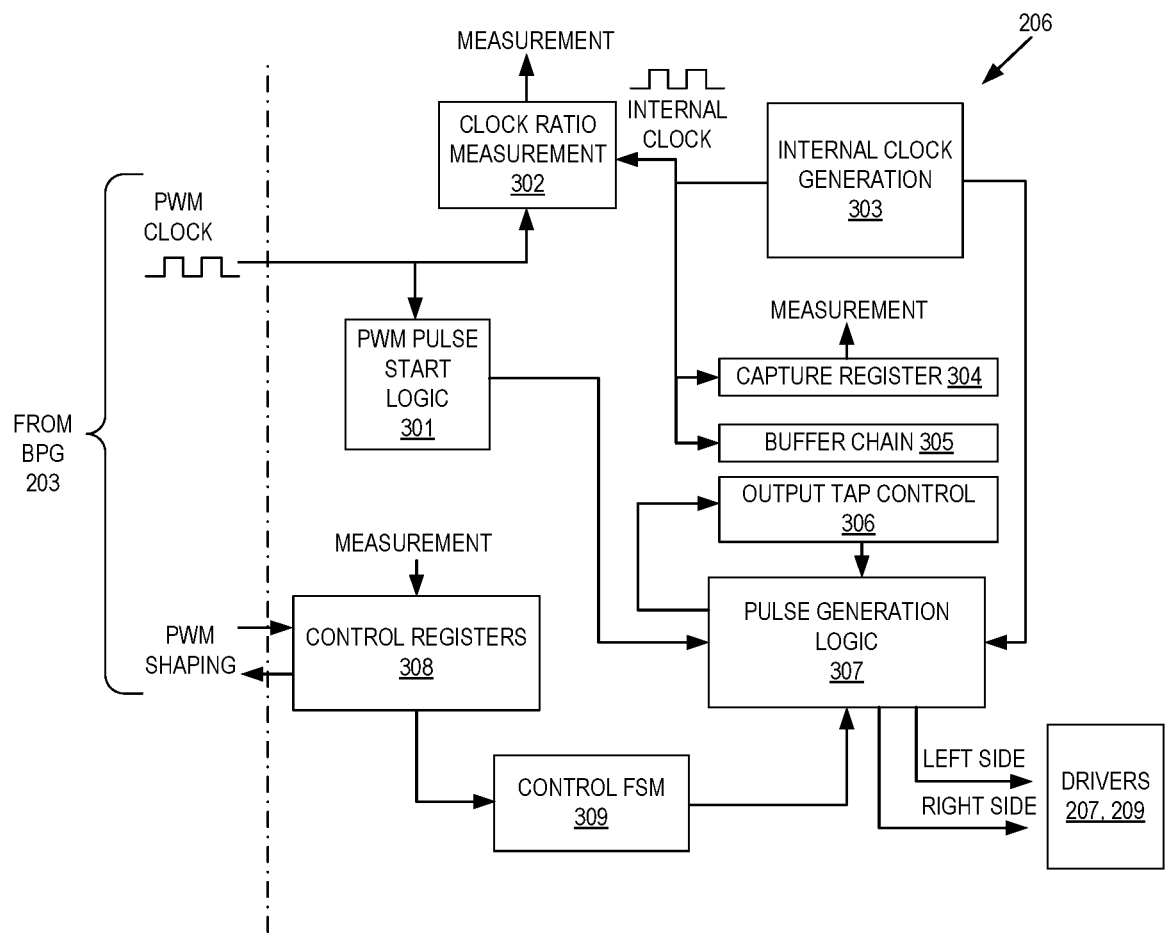
FIG. 3 illustrates a block diagram of PWM pulse generation in accordance with embodiments of the present disclosure.

Referring to FIG. 3, the DCC circuitry 206 receives the PWM clock signal as time base information. In other words, the PWM clock signal is the timing basis upon which PWM pulses are generated. As will be described, the PWM clock is used to determine the start of the generation of each PWM pulse. For example, the system may be configured to generate a PWM pulse every n-th PWM clock cycle, wherein n is an integer greater than or equal to 1. The PWM clock may be configured to be "relatively slow" (e.g., 20-40 MHz). The DCC circuitry 206 implements an internally generated clock signal, which may be configured to be a faster (relative to the frequency of the PWM clock signal) internal free-running clock signal (e.g., utilizing any well-known clock generation circuit 303).

Note that the precise clock frequency generated for the internal clock signal is irrelevant and may change across technologies/devices/time, and thus permits a very simple implementation for such a clock generation circuit 303 (e.g., in the form of a digital ring oscillator), and can be implemented to be as fast as the selected technology (i.e., for the DCC circuitry 206) permits (e.g., ~500 MHz, but does not necessarily need to be implemented to generate an internal clock signal in the GHz range). This permits the usage of cost-efficient technologies (e.g., better suited for implementing class D driver elements for the drivers 207, 209), and diminishes the negative effects of other associated issues (e.g., emissions resulting from utilization of a GHz signal, etc.). The various elements illustrated in FIG. 3 will be further described with respect to FIGS. 4-8.

Figure 4:
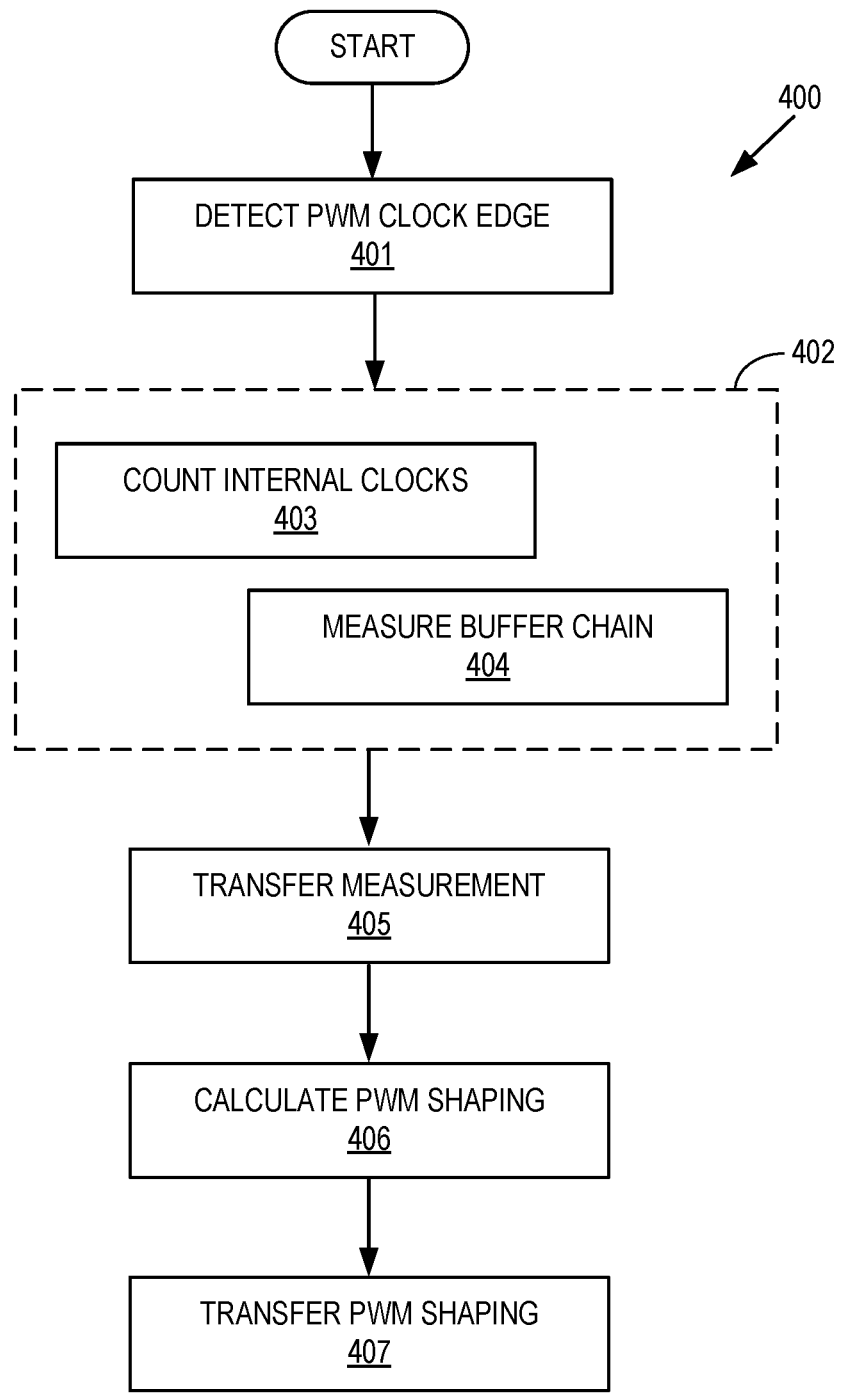
FIG. 4 illustrates a flowchart block diagram of measurements performed in accordance with embodiments of the present disclosure.

Referring to FIG. 4 with reference to FIG. 3, there is illustrated a flowchart block diagram of a system and method 400 for performing the previously noted first and second measurements in accordance with embodiments of the present disclosure. In block 401, the clock ratio measurement circuitry 302 detects a clock edge of the PWM clock signal received from the BPG 203. This detected PWM clock edge is utilized as a time reference for the measurement performed by the clock ratio measurement circuitry 302. The block 402 outlined by the dashed line represents performances of the first and second measurements within the DCC circuitry 206. In the block 403, the clock ratio measurement circuitry 302 determines a ratio of the frequency of the PWM clock signal received from the BPG circuitry 203 to the frequency of the internally generated clock signal supplied and generated by the internal clock generation circuitry 303. For example, the clock ratio measurement circuitry 302 may be implemented with a counter that counts the number of pulses of the internal clock signal corresponding to one or more cycles of the PWM clock signal.

Figure 5:
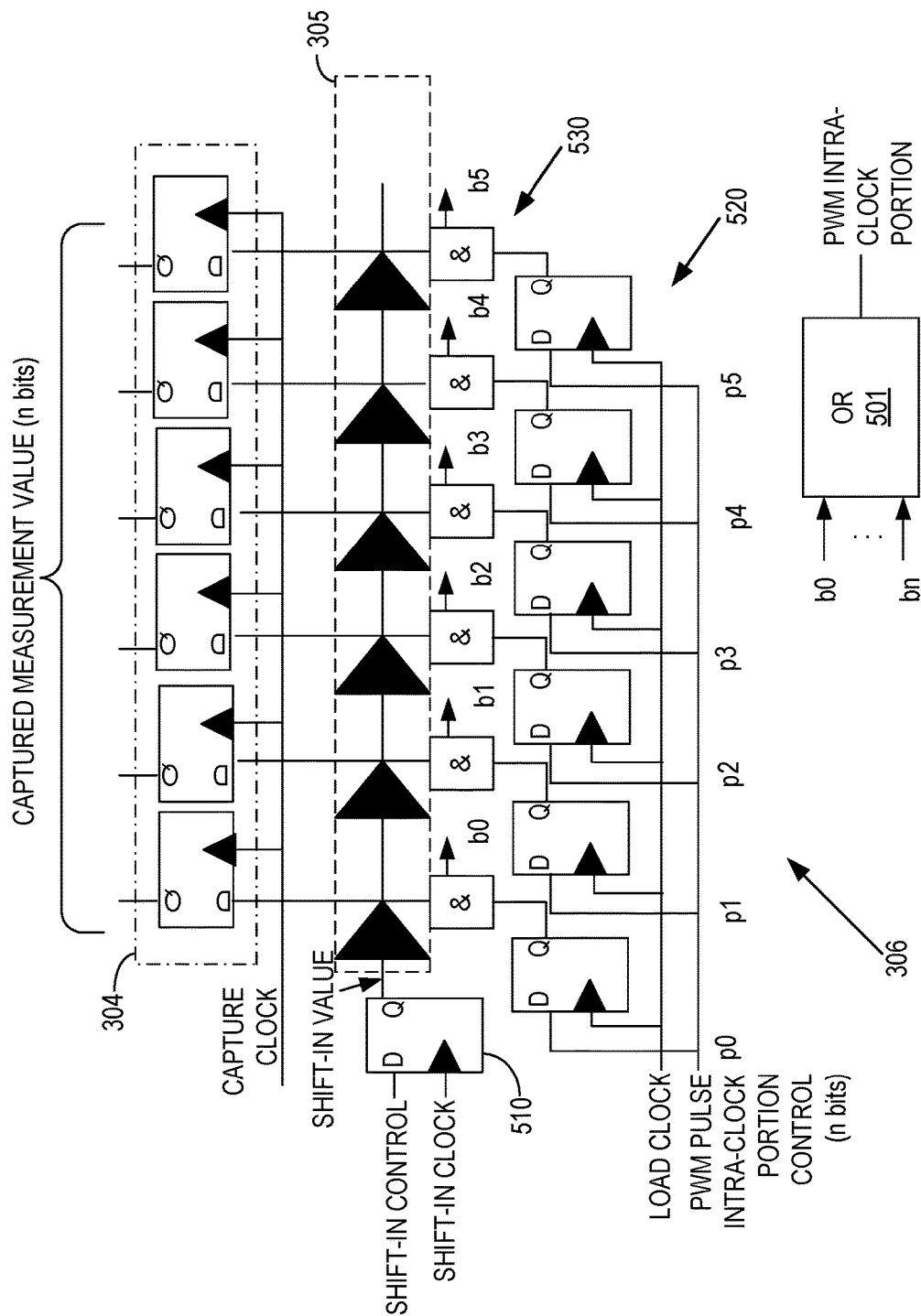
FIG. 5 illustrates a logic circuit diagram configured in accordance with embodiment of the present disclosure.

As will be further described with respect to FIG. 5, in the block 404, the buffer chain 305 is utilized to measure the number of propagation delay elements (e.g., delay buffers) that correspond to the propagation delay associated with a single cycle of the internal clock signal, which determines the intra-clock portion of the PWM pulse being generated, providing a higher accuracy without requiring a clock signal operating in a GHz range for this generation and also being adjustable during runtime. By selecting equal propagation delay elements (e.g., by controlling the synthesis parameters in a well-known manner) having a minimal propagation delay for the utilized technology, a very fine granular selection of the intra-clock delay portion is possible using only digital elements. When the selected delay element type has a minimum propagation delay for the utilized technology and the delay between these elements is minimized (e.g., by well-known synthesis parameters), the resulting possible granularity of delay control is the maximum possible with digital elements for the given technology. This second measurement by the buffer chain 305 is captured by the capture register 304.

In the block 405, the measurement results by the clock ratio measurement circuitry 302 and within the capture register 304 are transmitted to and stored within registers of the control registers 308. These measurement results are transferred to the BPG circuitry 203. Such transfers may occur regularly or irregularly; e.g., a transfer may be performed only when the measurement results have changed. In the block 406, software within the BPG circuitry 203 (e.g., see FIG. 9 described herein) uses these measurement results to calculate the PWM shaping information to be utilized for the generation of PWM pulses in the context of the selected PWM clock frequency. For each PWM pulse to be generated, the software considers the requirements for generation of the AC power signal, while also possibly including information pertaining to any messages to be communicated by the transmitter 103 to the receiver 110, and then utilizes the results of the first and second measurements to calculate the PWM shaping information in the context of the selected PWM clock. In the block 407, the calculated PWM shaping information is transferred from the BPG circuitry 203 to registers within the control registers 308 for subsequent utilization within the DCC circuitry 206 as will be described herein.

FIG. 5 illustrates further details of a non-limiting exemplary implementation of the capture register 304, the buffer chain 305, and the output tap control 306. As previously noted, for calculations of certain duty cycles by the BPG circuitry 203, use of only the first measurements (i.e., the ratio of the frequencies of the PWM clock signal and the internal clock signal) is insufficient to accurately designate such duty cycles in a satisfactory manner. As a result, embodiments of the present disclosure incorporate the second measurements in order to improve the accuracy. In accordance with embodiments of the present disclosure, the required accuracy of the widths (i.e., duty cycles) for generated PWM pulses is achieved by implementation of the buffer chain 305, which provides the portion of the PWM pulse width accuracy that cannot be generated solely with use of the internal clock signal. Such an achievable accuracy is technology dependent (i.e., on the technology utilized to implement the propagation delay elements within the buffer chain 305), and may provide at least two to three more bits of extra accuracy.

As will be described with respect to FIG. 6, the buffer chain 305 and the capture register 304 are utilized to perform the second measurement. In accordance with embodiments of the present disclosure, the buffer chain 305 includes a plurality of propagation delay elements (e.g., delay buffers) coupled in series, whereby the first delay buffer has its input receiving a shift-in value from an output of the shift-in flip-flop 510. Under control of a shift-in clock signal, which is derived from the internal clock signal, the flip-flop 510 receives as its data input a shift-in control signal. The capture register 304 includes a plurality of flip-flops corresponding to each of the delay buffers of the buffer chain 305.

As will be described with respect to FIG. 7, the buffer chain 305 and the output tap control 306 are utilized to determine the PWM intra-clock portion of the duty cycles for each PWM pulse to be generated. The output tap control 306 includes a plurality of flip-flops 520, each corresponding to one of the delay buffers in the buffer chain 305. Each of the flip-flops 520 within the output tap control 306 is controlled by a load clock signal, which is also derived from the internal clock signal. As will be further described, the data input to the flip-flops 520 of the output tap control 306 is an n-bit PWM pulse intra-clock portion control signal, with these data inputs designated as p0-p5. The output tap control 306 further includes a plurality of logic AND gates 530 each corresponding to one of the delay buffers within the buffer chain 305. The inputs to each of the logic AND gates 530 are outputs from its corresponding delay buffer and flip-flop. The outputs of the logic AND gates 530 are designated herein as b0-b5. The output tap control 306 further includes a logic OR gate 501 that receives the b0-b5 outputs from the logic AND gates 530, and outputs a PWM intra-clock portion signal for use by the pulse generation logic circuitry 307 in production of each of the PWM pulses.

Note that embodiments of the present disclosure are not limited to the particular configuration illustrated in FIG. 5. Though the buffer chain 305 is illustrated as having six delay buffers, the capture register 304 as having six flip-flops, and the output tap control 306 has having six flip-flops and six logic AND gates, embodiments of the present disclosure may be implemented with any number of such elements. For example, certain embodiments may be implemented with a much larger buffer chain and related elements (e.g., capture flip-flops, AND gates, output tap control flip-flops). Typical delay chains are often implemented using 32 to 128 delay elements. For example, the minimum number of elements for the buffer chain 305 can be calculated for a given technology from the technology parameters for the selected delay elements (e.g., minimum delay of a minimum delay buffer) and the potential maximum frequency of the internal clock generation circuitry 303.

Figure 6:
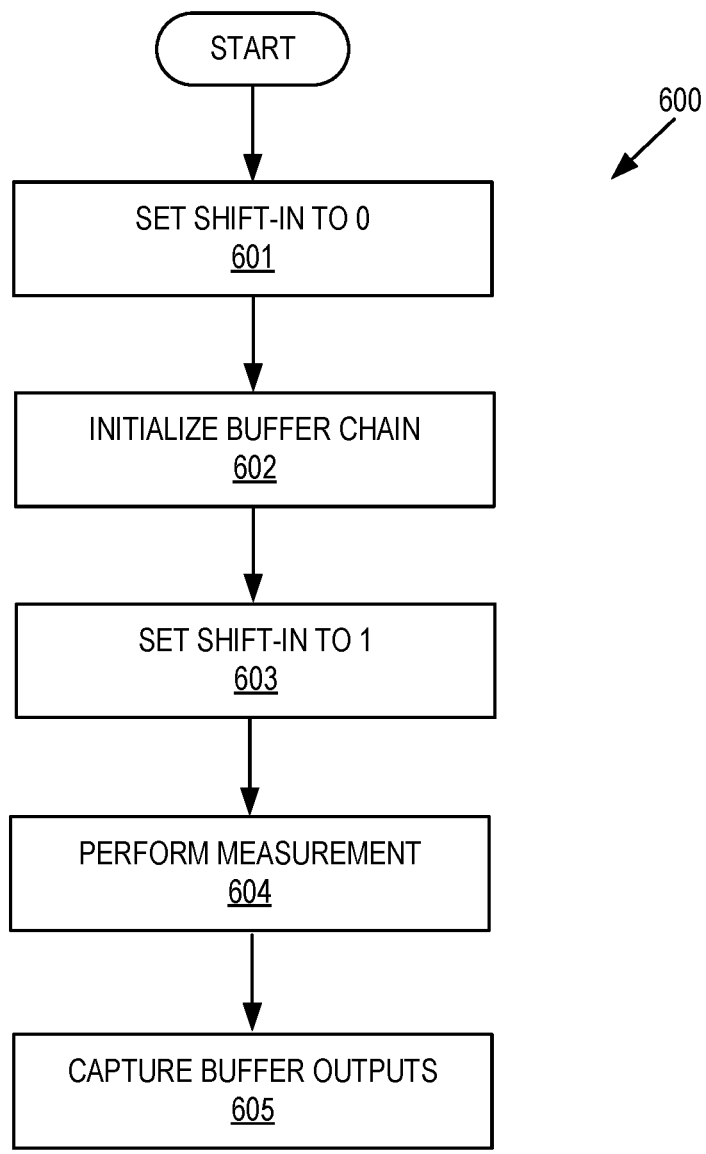
FIG. 6 illustrates a flowchart block diagram of measurement of an intra-clock portion of an internal clock in accordance with embodiments of the present disclosure.

FIG. 6 illustrates a flowchart block diagram of a system and method 600 for performing the second measurement pertaining to the PWM intra-clock portion, i.e., a measurement that determines how many of the delay buffers (i.e., the signal propagation delay associated with the delay buffers) fall within a single cycle of the internal clock signal. Various aspects of the system and method 600 may be performed under the control of the FSM 309. In the block 601, a logic 0 value is set by shifting in such a logic 0 value into the flip-flop 510 (as the shift-in control value) for output to the buffer chain 305 as the "shift-in value". In the block 602, the buffer chain 305 is initialized with the shift-in logic 0 value (e.g., by the passing of a predetermined number of cycles of the internal clock signal) so that all of the delay buffers have a logic 0 output. The number of cycles of the internal clock signal utilized for such an initialization may be determined by sensing when the output of the last delay buffer in the buffer chain 305 outputs a logic 0 value, or may be predetermined within the system and method 600 since the minimum delay of each of the delay buffers within the buffer chain 305 are known technology parameters. In the block 603, a logic 1 value is then shifted into the buffer chain 305 through the flip-flop 510 for output to the buffer chain 305 as the "shift-in value," which starts the measurement.

In the block 604, a measurement is then performed after passage of a complete cycle of the internal clock signal. Note that a single cycle of the internal clock signal may be sufficient for performing such a measurement. However, in accordance with alternative embodiments of the present disclosure, multiple measurements may be performed that involve passage of more than one cycle of the internal clock signal (utilizing a larger delay chain that is appropriately sized for this purpose) and then averaging these multiple measurement results. In the block 605, outputs of the delay buffers within the buffer chain 305 are captured within corresponding flip-flops of the capture register 304. The plurality of flip-flops is configured to capture the outputs of the delay buffers in response to assertion of a capture clock signal derived from the internal clock signal, wherein the assertion of the capture clock signal occurs one clock period of the internal clock signal subsequent to the assertion of the shift-in clock signal. As an example, as the shift-in logic 1 value is propagated through the delay buffers of the buffer chain 305, after passage of a complete cycle of the internal clock signal (or a derivation thereof), the logic 1 value may have propagated through the first four delay buffers. At that moment, since the internal clock signal (or a derivation thereof) is also being used to clock the corresponding flip-flops of the capture register 304, the logic values at the outputs of all of the delay buffers of the buffer chain 305 will be output to their corresponding flip-flops. In this non-limiting example with six delay buffers, the measurement value captured within the capture register will be a 6-bit value of 111100, which would represent that the amount of propagation delay associated with four delay buffers approximately equates to the time passage of one complete cycle of the internal clock signal. This captured measurement value (the second measurement) is then output from the capture register 304 and stored in registers within the control registers 308. For this purpose, in accordance with certain embodiments of the present disclosure, the measurement result may be condensed (e.g., by counting the number of leading 1's and only storing this number in a control register).

Figure 9:
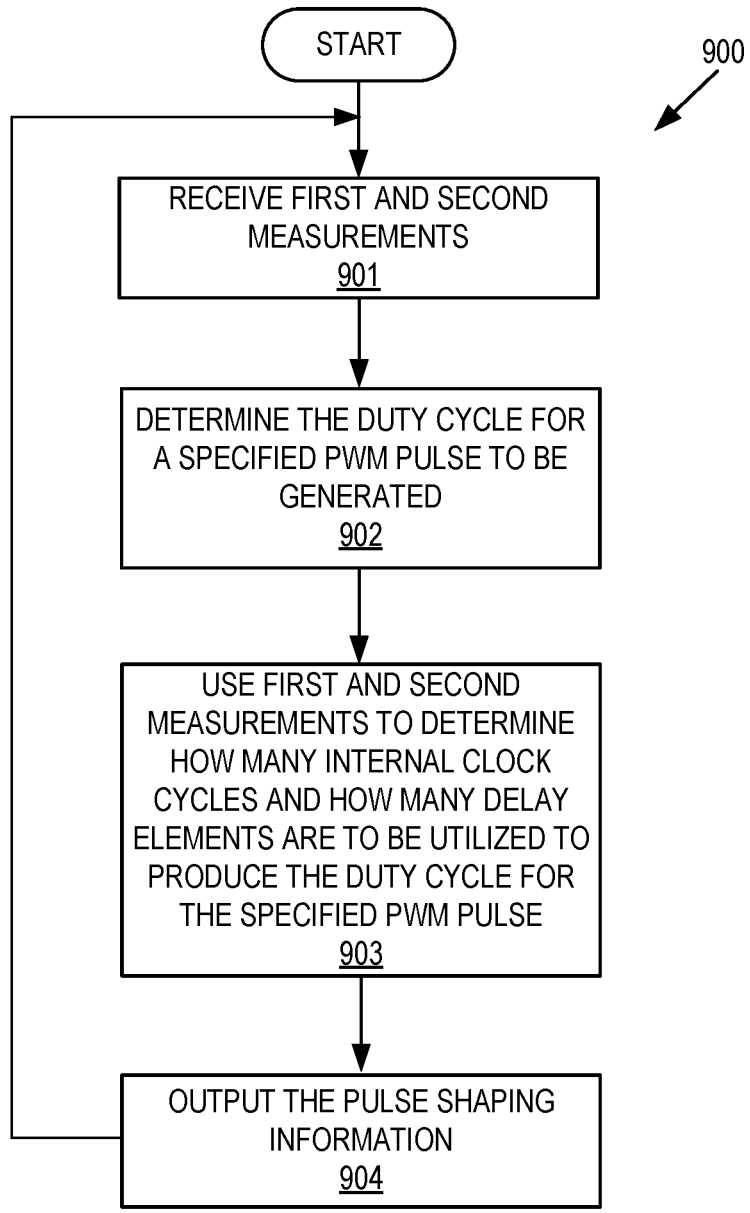
FIG. 9 illustrates a flowchart block diagram of calculating PWM pulse shaping information in accordance with embodiments of the present disclosure.

Referring to FIG. 9, there is illustrated a non-limiting example of a system and method 900 configured to calculate the power shaping information to be utilized for the generation of PWM pulses as a function of the first and second measurements. The system and method 900 may be implemented in software for execution within the BPG circuitry 203 (see block 406 of FIG. 4). In the block 901, the BPG circuitry 203 receives the most recent first and second measurements from the control registers 308. In the block 902, the BPG circuitry 203 determines the duty cycle for the next PWM pulse to be generated in the context of the PWM clock and utilizing the PWM duty cycle information calculated in a well-known manner by the software function 205. In the block 903, the BPG circuitry 203 uses the first and second measurements to determine how many cycles of the internal clock signal (the "PWM inter-clock portion") and how many propagation delay elements of the buffer chain 305 (the "PWM intra-clock portion") are to be utilized to produce the duty cycle determined in the block 902. In the block 904, these calculated PWM inter-clock portion and PWM intra-clock portion are the PWM shaping information that is then transferred from the BPG circuitry 203 to the control registers 308. As will be described, the PWM inter-clock portion will be utilized by the pulse generation logic circuitry 307 to count the number of cycles of the internal clock signal for generating the initial portion of the PWM pulse, and the PWM intra-clock portion will be utilized by the output tap control 306 to establish the remaining fractional portion of the generated PWM pulse. The system and method 900 then returns to the Start to repeat the foregoing to calculate the PWM shaping information from the most recent first and second measurements for the next PWM pulse to be generated. In accordance with certain embodiments of the present disclosure, the receiving of measurement results 901 may be performed before performing all corresponding calculations, and the output of the generated pulse shaping information 904 may be performed after performing all these calculations.

Figure 7:
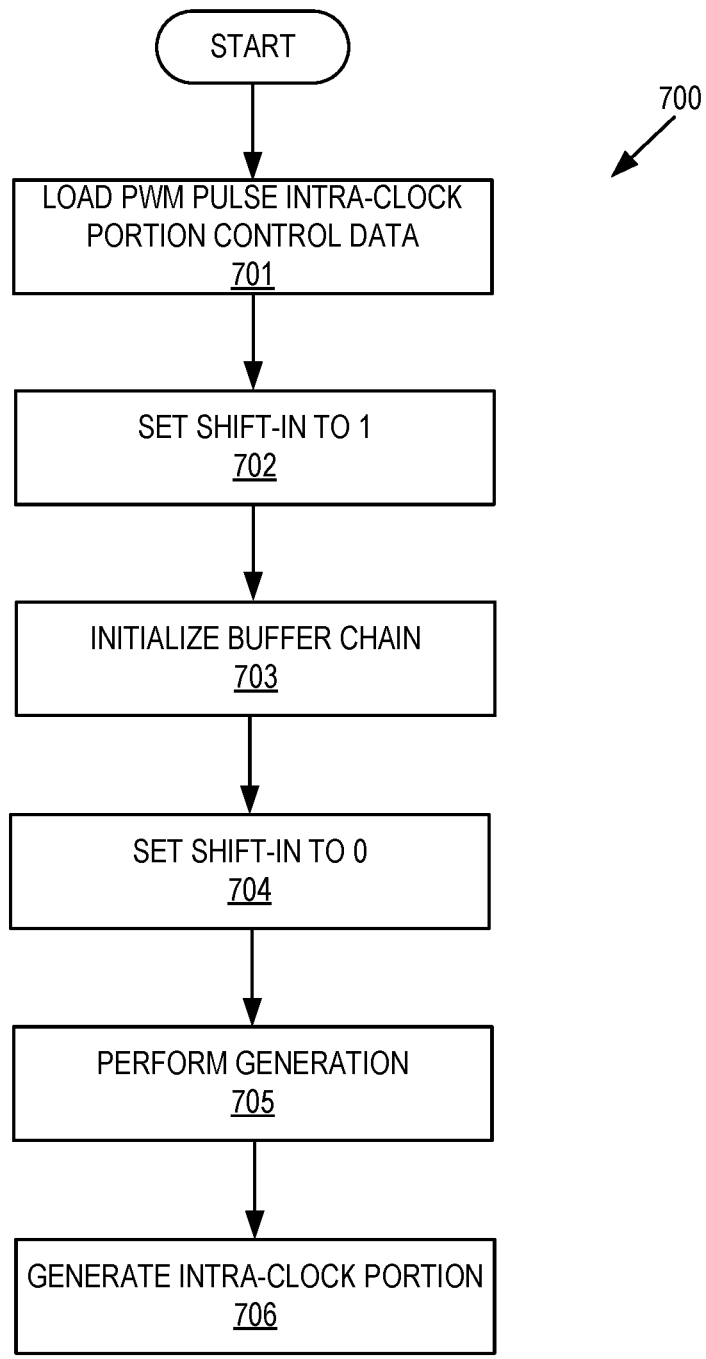
FIG. 7 illustrates a flowchart block diagram of a generation of the intra-clock portion of a PWM pulse in accordance with embodiment of the present disclosure.

FIG. 7 illustrates a system and method 700 for generating the PWM intra-clock portion of duty cycles for each PWM pulse being generated by the pulse generation logic circuitry 307. Results of the system and method 700 are utilized by the block 805 as further described herein with respect to FIG. 8. Various aspects of the system and method 700 may be performed under the control of the FSM 309.

Recall that the software executing within the BPG 203 had utilized the second measurement to calculate the PWM intra-clock portion of the PWM shaping information. This PWM intra-clock portion is referred to with respect to FIGS. 5 and 7 as the PWM pulse intra-clock portion control data. In the block 701, for each particular PWM pulse to be generated, the control FSM 309 loads the PWM pulse intra-clock portion control bits into the flip-flops 520 (represented as the m-bit p0-p5 values in FIG. 5) under control of a load clock signal, which is derived from the internal clock signal. These PWM pulse intra-clock portion control bits designate the number of delay buffers in the buffer chain 305 determined by the software (e.g., see the system and method 900 described with respect to FIG. 9) executing in the BPG circuitry 203 to represent the fractional portion of a single cycle of the internal clock signal to be added to the integer multiple of cycles of the internal clock signal (as calculated by the software) in order to more accurately create the duty cycle of the PWM pulse to be generated.

Before the PWM pulse intra-clock portion control data is to be used to generate the PWM intra-clock portion, blocks 702-703 initialize the buffer chain 305. In the block 702, a logic 1 value (the shift-in control) is shifted in by the shift-in clock to the buffer chain 305 through the flip-flop 510 for output to the buffer chain 305 as the "shift-in value." In the block 703, a number of clock cycles of the internal clock signal (or a derivation thereof) are allowed to pass in order to initialize the delay buffers within the buffer chain 305 so that all of the delay buffers have a logic 1 output. The number of cycles of the internal clock signal utilized for such an initialization may be determined by sensing when the output of the last delay buffer in the buffer chain 305 outputs a logic 1 value, or may be predetermined within the system and method 700 since the maximum delay of each of the delay buffers within the buffer chain 305 are known technology parameters.

After the initialization of the delay buffers, the buffer chain 305 is then ready for generating of the PWM intra-clock portion in combination with the output tap control 306. In the block 704, a logic 0 value is shifted in to the buffer chain 305 through the flip-flop 510 (as the shift-in control value) for output to the buffer chain 305 as the "shift-in value." In the block 705, generation of the PWM intra-clock portion is performed by forwarding the logic 0 value for propagation through the delay buffers in the buffer chain 305, which starts the generation.

In the block 706, as the logic 0 value propagates through the delay buffers, the PWM intra-clock portion is output by the combinatorial logic circuitry of the logic AND gates 530 and the logic OR gate 501.

Consider the following non-limiting example whereby the software executing within the BPG circuitry 203 has determined that the duty cycle for the next PWM pulse to be generated by the pulse generation logic 307 will utilize three of the delay buffers in the buffer chain 305. The PWM intra-clock portion of the PWM pulse shaping information received by the control registers 308 and delivered by the control FSM 309 to the flip-flops 520 as the PWM pulse intra-clock portion control bits will load the bits 111000 as the p0-p5 values into the flip-flops 520.

Upon completion of the full cycle of the last internal clock cycle counted by the pulse generation logic 307 for generating the PWM pulse, the blocks 704 and 705 are performed whereby a logic 0 value is shifted-in to the buffer chain 305 for propagating through the delay buffers.

Recall that the buffer chain 305 had been previously initialized by the blocks 702-703 to contain logic 1 values at the outputs of all of the delay buffers. Thus, it can be readily understood that until the logic 0 value has propagated through the third delay buffer of the buffer chain 305, the combinatorial logic of the logic AND gates 530 and the logic OR gate 501 will output a logic 1 value as the PWM intra-clock portion output from the logic OR gate 501.

Therefore, until this occurrence, the PWM pulse will continue to be generated by the pulse generation logic 307 as further described with respect to the block 805 of the system and method 800. When the logic 0 value has propagated through the third delay buffer, then, as described with respect to the block 806, the logic 0 value for the PWM intra-clock portion output from the logic OR gate 501 will trigger the pulse generation logic 307 to complete the duty cycle of the generated PWM pulse.

Note that the generation of the PWM intra-clock portion may be performed in the clock cycle after the last full internal clock cycle needed for generating a PWM pulse. As can be readily appreciated, for every PWM pulse to be generated by the pulse generation logic circuitry 307, there may be different PWM pulse intra-clock portion control data that is then loaded into the flip-flops 520 of the output tap control 306.

Figure 8:
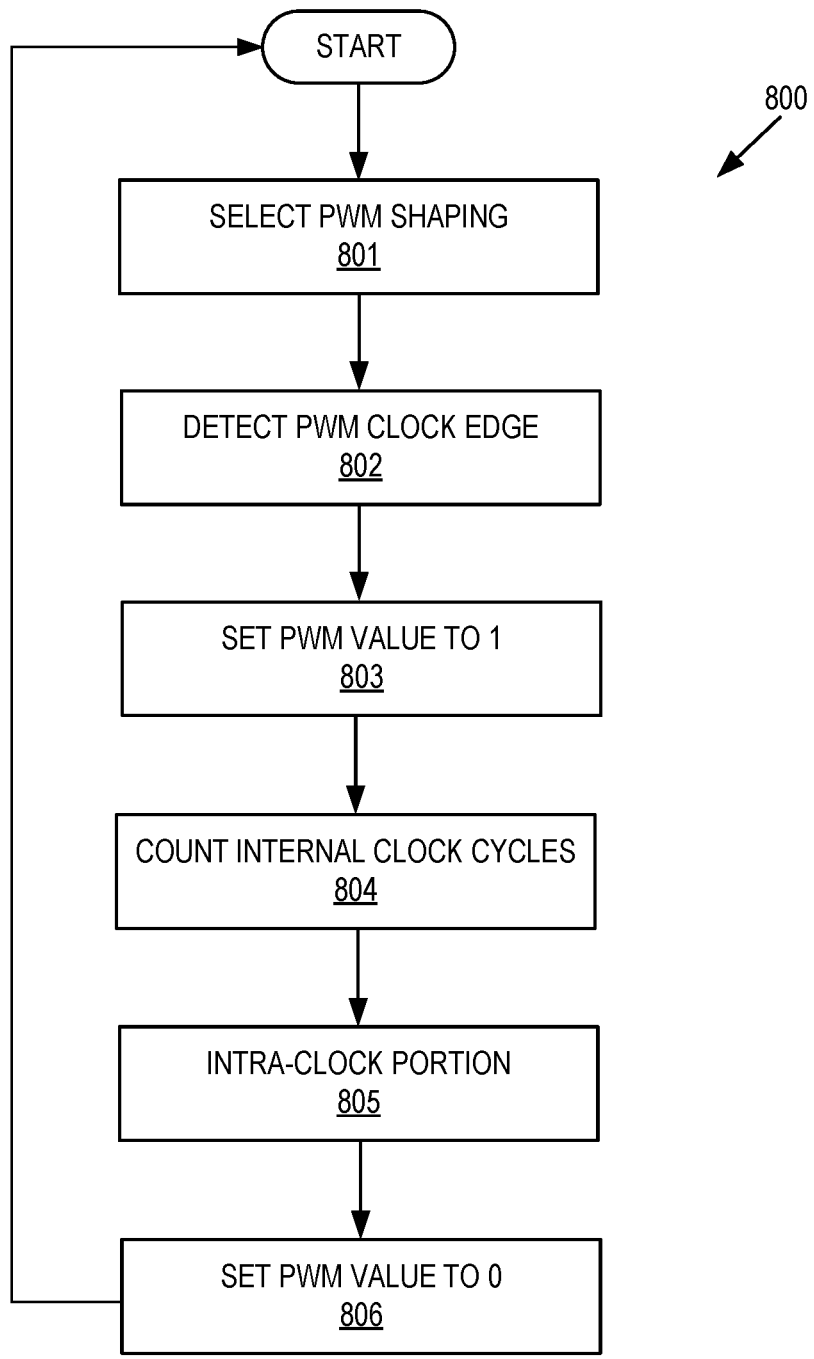
FIG. 8 illustrates a flowchart block diagram of a generation a PWM pulse in accordance with embodiments of the present disclosure.

FIG. 8 illustrates a flowchart block diagram of a system and method 800 for generation of each of the PWM pulses. Various aspects of the system and method 800 may be performed under the control of the FSM 309. In the block 801, the control FSM 309 selects the PWM shaping information to be utilized for generating the next PWM pulse by the pulse generation logic 307. The PWM shaping information includes the result of the calculations performed by the BPG circuitry 203 (see FIG. 9) of the PWM inter-clock portion and the PWM intra-clock portion that designate the duty cycle of the next PWM pulse to be generated. The control FSM 309 may monitor the PWM clock signal to determine when to retrieve the PWM shaping information from the control registers 308, since, for example, the system may be designed to generate a PWM pulse every n-th cycle of the PWM clock signal.

In the block 802, the pulse generation logic 307 utilizes a detected clock edge of the PWM clock signal by the PWM pulse start logic circuitry 301, which is utilized as a time reference for generation of each of the PWM pulses (i.e., when to begin generation of each PWM pulse). The PWM pulse start logic circuitry 301 may be implemented as a clock edge sensing circuit, which can observe the PWM clock signal and count the number of clock edges; after a predetermined number of counted clock edges, an output signal is sent to the pulse generation logic circuitry 307.

In the block 803, circuitry within the pulse generation logic 307 sets the logic value for generating the PWM pulse to a logic value of 1 (also referred to herein as the "PWM pulse generation value"), which is triggered by the internal clock and enabled by the detected PWM clock edge. In other words, the pulse generation logic circuitry 307 utilizes the detected PWM clock edge to determine when it is enabled to begin generation of the next PWM pulse, and then uses the internal clock signal to trigger the start of the next PWM pulse, which can be performed by setting the PWM pulse generation value to 1. As is well-known in the art, logic circuitry for generating pulses may do so in response to a received logic signal whereby a pulse is generated when the received logic signal has an asserted logic value (e.g., a logic 1 value), and the pulse is not generated when the received logic signal has not been asserted (e.g., a logic 0 value). The pulse generation logic 307 also will select whether the left-side driver 207 or the right-side driver 209 will utilize this particular PWM pulse.

In the block 804, the pulse generation logic circuitry 307 counts (e.g., with a well-known clock cycle counter) a number of cycles of the internal clock signal as defined by the calculated PWM inter-clock portion of the PWM shaping information received from the control registers 308. It is during this time that the PWM inter-clock portion of the PWM pulse to be generated is produced whereby the PWM pulse generation value for the PWM pulse being generated is maintained at a value of 1. Note that performance of the blocks 702-703 may occur sometime during the performance of the block 804 in order to initialize the buffer chain 305 as described with respect to FIG. 7, which may be performed n−1 clock cycles before the counter reaches the defined value in the PWM shaping information (where n is the number of clock cycles for all buffer elements to have a defined output value, as described earlier). A performance of the blocks 702-703 in these cycles permits use of the buffer chain 305 in all earlier clock cycles of the performance of the block 804 for performing at least one measurement as described in the system and method 600 of FIG. 6. In accordance with embodiments of the present disclosure, utilization of the buffer chain 305 for performing both the second measurement (see the system and method 600 of FIG. 6) and the generation of the intra-clock portion of the PWM signal, as described in FIG. 8, because this results in the consistent and accurate use of the corresponding buffer delay elements across all possible process, temperature, and voltage dependencies that might be experienced within circuitry implementing the DCC 206 and/or the PWM pulse generation element 202.

In the block 805, the PWM intra-clock portion to be generated is received from the logic OR gate 501 of the output tap control 306 (see the blocks 705-706 of the system and method 700 described with respect to FIG. 7). The pulse generation logic 307 may be configured to accomplish this during the last internal clock cycle of the number of internal clock cycles counted during the block 804, for example, since the generation of the PWM pulse is a function of the received internal clock signal, which is also used as the load clock for the flip-flops 520. The pulse generation logic 307 will maintain the PWM pulse generation value at a value of 1 as long as the output logic value of the logic OR gate is a 1. As can be readily appreciated, the pulse generation logic 307 generates each of the PWM pulses by effectively concatenating the PWM inter-clock portion and the PWM intra-clock portion that designate the duty cycle of the next PWM pulse to be generated.

In the block 806, the PWM pulse generation value for the PWM pulse being generated is set to a value of 0 after the number of cycles of the internal clock signal (as designated by the calculated PWM inter-clock portion of the PWM shaping information) have passed and the amount of time has passed as determined by receipt of the PWM intra-clock portion signal from the logic OR gate 501. In accordance with embodiments of the present disclosure, this may be performed by logic circuitry within the pulse generation logic 307, such as a combinatorial logic OR of the output of the clock cycle counter being set to a logic value of 0 after counting all of the specified internal clock cycles, and the output of the logic OR gate 501. As understood by those skilled in the art, any additional delays associated with the implementations of the logic AND gates 530 and logic OR gate 501 on the generated intra-clock portion and a final OR gate (which may be implemented to perform a logical OR on the output of the inter-clock delay (the number of full internal clock cycles) and the intra-clock delay (the output of the logic OR gate 501) can be easily compensated for in the generation of the final PWM signal; e.g., by implementing an equivalent logic that delays the start of the PWM pulse accordingly (as a non-limiting example since there are other ways to achieve this compensation).

The foregoing system and method 800 may be repeated for each of the PWM pulses generated by the pulse generation logic 307.

Due to the implementation of the internal clock signal separately from the PWM clock signal, embodiments of the present disclosure are capable of operating even when there are changes in the fundamental frequency.

Aspects of the present disclosure provide a system for determining duty cycles for PWM pulses suitable for generating a signal at a specified frequency, wherein the system includes clock ratio measurement circuitry configured to perform a first measurement of a ratio between a first frequency of a first clock signal and a second frequency of a second clock signal; propagation delay circuitry configured to perform a second measurement of a number of propagation delay elements corresponding to a single cycle of the second clock signal; circuitry configured to determine an inter-clock portion of a first specified duty cycle as a function of the first measurement; circuitry configured to determine an intra-clock portion of the first specified duty cycle as a function of the second measurement; and circuitry configured to output a PWM pulse signal having the first specified duty cycle, wherein the first specified duty cycle is composed of the inter-clock portion concatenated with the intra-clock portion. The specified frequency of the signal to be generated may be related to the first frequency. The first and second clock signals may be generated independently from each other. The pulse generation logic circuitry may be configured to output the PWM pulses every n-th cycle of the first frequency, wherein n is an integer greater than or equal to 1. The circuitry configured to determine the inter-clock portion of the first specified duty cycle may include circuitry configured to calculate a maximum number of complete cycles of the second clock signal that fall within the first specified duty cycle. The circuitry configured to determine the intra-clock portion of the first specified duty cycle may include circuitry configured to calculate a maximum number of propagation delay elements that fall within that portion of the first specified duty cycle between a last complete cycle of the second clock signal and an end of the first specified duty cycle, wherein the intra-clock portion represents a less than whole fraction of a complete cycle of the second clock signal. The system may further include that the clock ratio measurement circuitry is configured to perform a third measurement of a ratio between a third frequency of the first clock signal and a fourth frequency of the second clock signal; that the propagation delay circuitry is configured to perform a fourth measurement of a number of propagation delay elements corresponding to a single cycle of the second clock signal; circuitry configured to determine an inter-clock portion of a second specified duty cycle as a function of the third measurement; circuitry configured to determine an intra-clock portion of the second specified duty cycle as a function of the fourth measurement; and circuitry configured to output a PWM pulse signal having the second specified duty cycle, wherein the second specified duty cycle is composed of the inter-clock portion concatenated with the intra-clock portion. The third frequency may be different from the first frequency, wherein the third frequency is configured to generate a signal having a different frequency than the specified frequency. The fourth frequency may be different from the second frequency due to variations in voltage or temperature of circuitry generating the second and fourth clock signals. The propagation delay circuitry may include a buffer chain including a plurality of the propagation delay elements coupled in series; a shift-in flip-flop having an output coupled to an input of a first one of the propagation delay elements, wherein the shift-in flip-flop is configured to load a particular logic value into the buffer chain in response to a shift-in clock signal derived from the second clock signal; and a plurality of flip-flops each having an input coupled to an output of a corresponding propagation delay element, wherein the plurality of flip-flops are configured to capture the outputs of the propagation delay elements in response to a capture clock signal derived from the second clock signal, wherein assertion of the capture clock signal occurs one or more clock periods subsequent to assertion of the shift-in clock signal. The circuitry configured to output the PWM pulse signal having the first specified duty cycle may include a plurality of flip-flops configured to receive the intra-clock portion in response to a load clock signal derived from the second clock signal; a plurality of logic AND gates each having a first input coupled to an output of a corresponding one of the propagation delay elements, and a second input coupled to an output of a corresponding one of the plurality of flip-flops; a logic OR gate having inputs coupled to outputs of each of the plurality of logic AND gates; and a shift-in flip-flop having an output coupled to an input of a first one of the propagation delay elements, wherein the shift-in flip-flop is configured to load a particular logic value into the number of propagation delay elements in response to a shift-in clock signal derived from the second clock signal.

Aspects of the present disclosure provide a method for generating PWM pulses each with specified duty cycles, wherein the method includes determining a duty cycle for a specified PWM pulse to be generated; determining a first measurement of a ratio between a PWM clock signal and an internally generated clock signal; determining a second measurement of a ratio between a number of propagation delay elements and a cycle of the internally generated clock signals; determining a first number of cycles of the internally generated clock signal and a second number of the propagation delay elements to be utilized to produce the duty cycle for the specified PWM pulse as a function of the first and second measurements; and utilizing the determined first number of cycles of the internally generated clock signal and the determined second number of propagation delay elements to generate the specified PWM pulse. The PWM clock signal and the internally generated clock signal may be generated independently from each other by different clock generation circuits. The determining of the second measurement may include propagating a logic value through a series of delay buffers; and capturing a data value representing the number of the delay buffers that propagated the logic value during one or more cycles of the internally generated clock signal. A width of the generated PWM pulse may be substantially equal to a time period as determined by the first number of cycles of the internally generated clock signal concatenated with the second number of the propagation delay elements. The internally generated clock signal may have a frequency that varies with changes in temperature or voltage. The generated PWM pulses may be configured to produce an AC wireless charging signal.

Aspects of the present disclosure provide a system for generating PWM pulses each with individually designated duty cycles, wherein the system includes a first clock circuit configured to generate a first clock signal having a first frequency; a second clock circuit configured to generate a second clock signal having a second frequency, wherein the second frequency is greater than the first frequency; clock ratio measurement circuitry configured to output a first measurement that is a ratio of the first frequency to the second frequency; circuitry configured to output a second measurement of how many propagation delay elements substantially equate to a single cycle of the second cock signal; and circuitry configured to designate a duty cycle for a PWM pulse as a function of the first and second measurements. The circuitry configured to output the second measurement may include a buffer chain including a plurality of the propagation delay elements coupled in series; a shift-in flip-flop having an output coupled to an input of a first one of the propagation delay elements, wherein the shift-in flip-flop is configured to load a particular logic value into the buffer chain in response to assertion of a shift-in clock signal derived from the second clock signal; and a plurality of flip-flops each having an input coupled to an output of a corresponding propagation delay element, wherein the plurality of flip-flops are configured to capture the outputs of the propagation delay elements in response to assertion of a capture clock signal derived from the second clock signal, wherein the assertion of the capture clock signal occurs one clock period of the second clock signal subsequent to the assertion of the shift-in clock signal. The duty cycle of the PWM pulse may be designated by a concatenation of (1) a specified number of cycles of the second clock signal as calculated from the first measurement, and (2) a specified number of propagation delay elements as calculated from the second measurement. The system may further include pulse generation logic configured to generate the PWM pulse, wherein the pulse generation logic includes circuitry configured to begin generation of the PWM pulse in response to a selected clock edge of the first clock signal; circuitry configured to continue generation of a first portion of the PWM pulse for a time period equal to a count of the specified number of cycles of the second clock signal; circuitry configured to continue generation of a second portion of the PWM pulse concatenated to the first portion for a time period equal to passage of a logic value through the specified number of propagation delay elements under control of the second clock signal; and circuitry configured to stop generation of the PWM pulse after generation of the second portion. The first and second clock circuits may be implemented so that the first and second clock signals are generated independently from each other.

Reference may be made herein to a device, circuit, circuitry, system, or module "configured to" perform a particular function or functions. It should be understood that this may include selecting predefined logic blocks and logically associating them, such that they provide particular logic functions, which includes monitoring or control functions. It may also include programming computer software-based logic, wiring discrete hardware components, or a combination of any or all of the foregoing.

In the description herein, a flow-charted technique may be described in a series of sequential actions. The sequence of the actions, and the element performing the actions, may be freely changed without departing from the scope of the teachings. Actions may be added, deleted, or altered in several ways. Similarly, the actions may be re-ordered or looped. Further, although processes, methods, algorithms, or the like may be described in a sequential order, such processes, methods, algorithms, or any combination thereof may be operable to be performed in alternative orders. Further, some actions within a process, method, or algorithm may be performed simultaneously during at least a point in time (e.g., actions performed in parallel), can also be performed in whole, in part, or any combination thereof.

Aspects of the present invention are described herein with reference to flowchart illustrations and/or block diagrams of methods, apparatus (systems), and computer program products according to embodiments of the present disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, microcontroller, or other programmable data processing apparatus to produce a machine that is configured to perform the functions/acts specified in the flowchart and/or block diagram block or blocks.

These computer program instructions may also be stored in a computer readable medium that can direct a computer, other programmable data processing apparatus, microcontroller, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, microcontroller, or other devices to cause a series of operational steps to be performed on the computer, other programmable apparatus microcontroller, or other devices to produce a computer implemented process such that the instructions which execute on the computer or other programmable apparatus provide processes for implementing the functions/acts specified in the flowchart and/or block diagram block or blocks.

Reference throughout this specification to "an embodiment," "embodiments," "certain embodiments," "various embodiments," or similar language means that a particular feature, structure, or characteristic described in connection with the embodiments is included in at least one embodiment of the present disclosure. Thus, appearances of the phrases "in embodiments," "in an embodiment," "embodiments," "in certain embodiments," and similar language throughout this specification may, but do not necessarily, all refer to the same embodiment. Furthermore, the described features, structures, aspects, or characteristics of the disclosure may be combined in any suitable manner in one or more embodiments. Correspondingly, even if features may be initially claimed as acting in certain combinations, one or more features from a claimed combination can in some cases be excised from the combination, and the claimed combination can be directed to a sub-combination or variation of a sub-combination.

The terminology used herein is for the purpose of describing particular embodiments and applications only and is not intended to be limiting of the disclosure. In the descriptions herein, numerous specific details are provided, such as examples of activities, circumstances, services, faults, errors, responses, reactions, processor activities, operations, events, mechanisms, software threads, cyberattacks, signals, or actions, programming, software modules, designer, manufacturer, or end user selections, network transactions, database queries, database structures, hardware modules, hardware circuits, hardware chips, controllers, etc., to provide a thorough understanding of embodiments of the disclosure. One skilled in the relevant art will recognize, however, that the disclosure may be practiced without one or more of the specific details, or with other methods, components, materials, activities, circumstances, services, faults, errors, responses, reactions, processor activities, operations, events, mechanisms, software threads, cyberattacks, signals, and so forth. In other instances, well-known structures, materials, or operations may be not shown or described in detail to avoid obscuring aspects of the disclosure.

To the extent not described herein, many details regarding specific materials, processing acts, and circuits are conventional, and may be found in textbooks and other sources within the computing, electronics, and software arts.

Benefits, advantages, and solutions to problems may have been described herein with regard to specific embodiments or applications. However, the benefits, advantages, solutions to problems, and any element(s) that may cause any benefit, advantage, or solution to occur or become more pronounced are not to be construed as critical, required, or essential features or elements of any or all the claims.

Those skilled in the art having read this disclosure will recognize that changes and modifications may be made to the embodiments without departing from the scope of the present disclosure. It should be appreciated that the particular implementations and applications shown and described herein may be illustrative of the disclosure and are not intended to otherwise limit the scope of the present disclosure in any way. Other variations may be within the scope of the following claims. Headings herein are not intended to limit the disclosure, embodiments of the disclosure, or other matter disclosed under the headings.

Herein, the term "or" may be intended to be inclusive, wherein "A or B" includes A or B and also includes both A and B. As used herein, the term "or" when used in the context of a listing of entities, refers to the entities being present singly or in combination. Thus, for example, the phrase "A, B, C, or D" includes A, B, C, and D individually, but also includes any and all combinations and subcombinations of A, B, C, and D. As used herein, the term "and/or" when used in the context of a listing of entities, refers to the entities being present singly or in combination. Thus, for example, the phrase "A, B, C, and/or D" includes A, B, C, and D individually, but also includes any and all combinations and subcombinations of A, B, C, and D.

As used herein, the singular forms "a," "an," and "the" may be intended to include the plural forms as well, unless the context clearly indicates otherwise.

The corresponding structures, materials, acts, and equivalents of all means or step plus function elements in the claims may be intended to include any structure, material, or act for performing the function in combination with other claimed elements as specifically claimed.

What is claimed is:

1. A system for determining duty cycles for pulse width modulation ("PWM") pulses suitable for generating a signal at a specified frequency, the system comprising:
    clock ratio measurement circuitry configured to perform a first measurement of a ratio between a first frequency of a first clock signal and a second frequency of a second clock signal;
    propagation delay circuitry configured to perform a second measurement of a number of propagation delay elements corresponding to a single cycle of the second clock signal;
    circuitry configured to determine an inter-clock portion of a first specified duty cycle as a function of the first measurement;
    circuitry configured to determine an intra-clock portion of the first specified duty cycle as a function of the second measurement; and
    circuitry configured to output a PWM pulse signal having the first specified duty cycle, wherein the first specified duty cycle is composed of the inter-clock portion concatenated with the intra-clock portion.

2. The system as recited in claim 1, wherein the specified frequency of the signal to be generated is related to the first frequency.

3. The system as recited in claim 1, wherein the first and second clock signals are generated independently from each other, and wherein the pulse generation logic circuitry is configured to output the PWM pulses every n-th cycle of the first frequency, wherein n is an integer greater than or equal to 1.

4. The system as recited in claim 1, wherein the circuitry configured to determine the inter-clock portion of the first specified duty cycle comprises circuitry configured to calculate a maximum number of complete cycles of the second clock signal that fall within the first specified duty cycle, and wherein the circuitry configured to determine the intra-clock portion of the first specified duty cycle comprises circuitry configured to calculate a maximum number of propagation delay elements that fall within that portion of the first specified duty cycle between a last complete cycle of the second clock signal and an end of the first specified duty cycle, wherein the intra-clock portion represents a less than whole fraction of a complete cycle of the second clock signal.

5. The system as recited in claim 1, further comprising:
the clock ratio measurement circuitry configured to perform a third measurement of a ratio between a third frequency of the first clock signal and a fourth frequency of the second clock signal;
the propagation delay circuitry configured to perform a fourth measurement of a number of propagation delay elements corresponding to a single cycle of the second clock signal;
circuitry configured to determine an inter-clock portion of a second specified duty cycle as a function of the third measurement;
circuitry configured to determine an intra-clock portion of the second specified duty cycle as a function of the fourth measurement; and
circuitry configured to output a PWM pulse signal having the second specified duty cycle, wherein the second specified duty cycle is composed of the inter-clock portion concatenated with the intra-clock portion.

6. The system as recited in claim 5, wherein the third frequency is different from the first frequency, wherein the third frequency is configured to generate a signal having a different frequency than the specified frequency.

7. The system as recited in claim 5, wherein the fourth frequency is different from the second frequency due to variations in voltage or temperature of circuitry generating the second and fourth clock signals.

8. The system as recited in claim 1, wherein the propagation delay circuitry comprises:
a buffer chain comprising a plurality of the propagation delay elements coupled in series;
a shift-in flip-flop having an output coupled to an input of a first one of the propagation delay elements, wherein the shift-in flip-flop is configured to load a particular logic value into the buffer chain in response to a shift-in clock signal derived from the second clock signal; and
a plurality of flip-flops each having an input coupled to an output of a corresponding propagation delay element, wherein the plurality of flip-flops are configured to capture the outputs of the propagation delay elements in response to a capture clock signal derived from the second clock signal, wherein assertion of the capture clock signal occurs one or more clock periods subsequent to assertion of the shift-in clock signal.

9. The system as recited in claim 1, wherein the circuitry configured to output the PWM pulse signal having the first specified duty cycle comprises:
a plurality of flip-flops configured to receive the intra-clock portion in response to a load clock signal derived from the second clock signal;

a plurality of logic AND gates each having a first input coupled to an output of a corresponding one of the propagation delay elements, and a second input coupled to an output of a corresponding one of the plurality of flip-flops;
a logic OR gate having inputs coupled to outputs of each of the plurality of logic AND gates; and
a shift-in flip-flop having an output coupled to an input of a first one of the propagation delay elements, wherein the shift-in flip-flop is configured to load a particular logic value into the number of propagation delay elements in response to a shift-in clock signal derived from the second clock signal.

10. A method for generating pulse width modulation ("PWM") pulses each with specified duty cycles, the method comprising:
determining a duty cycle for a specified PWM pulse to be generated;
determining a first measurement of a ratio between a PWM clock signal and an internally generated clock signal;
determining a second measurement of a ratio between a number of propagation delay elements and a cycle of the internally generated clock signals;
determining a first number of cycles of the internally generated clock signal and a second number of the propagation delay elements to be utilized to produce the duty cycle for the specified PWM pulse as a function of the first and second measurements; and
utilizing the determined first number of cycles of the internally generated clock signal and the determined second number of propagation delay elements to generate the specified PWM pulse.

11. The method as recited in claim 10, wherein the PWM clock signal and the internally generated clock signal are generated independently from each other by different clock generation circuits.

12. The method as recited in claim 10, wherein determining of the second measurement comprises:
propagating a logic value through a series of delay buffers; and
capturing a data value representing the number of the delay buffers that propagated the logic value during one or more cycles of the internally generated clock signal.

13. The method as recited in claim 10, wherein a width of the generated PWM pulse is substantially equal to a time period as determined by the first number of cycles of the internally generated clock signal concatenated with the second number of the propagation delay elements.

14. The method as recited in claim 10, wherein the internally generated clock signal has a frequency that varies with changes in temperature or voltage.

15. The method as recited in claim 10, wherein the generated PWM pulses are configured to produce an AC wireless charging signal.

16. A system for generating pulse width modulation ("PWM") pulses each with individually designated duty cycles, the system comprising:
a first clock circuit configured to generate a first clock signal having a first frequency;
a second clock circuit configured to generate a second clock signal having a second frequency, wherein the second frequency is greater than the first frequency;
clock ratio measurement circuitry configured to output a first measurement that is a ratio of the first frequency to the second frequency;

circuitry configured to output a second measurement of how many propagation delay elements substantially equate to a single cycle of the second cock signal; and circuitry configured to designate a duty cycle for a PWM pulse as a function of the first and second measurements.

17. The system as recited in claim 16, wherein the circuitry configured to output the second measurement comprises:

a buffer chain comprising a plurality of the propagation delay elements coupled in series;

a shift-in flip-flop having an output coupled to an input of a first one of the propagation delay elements, wherein the shift-in flip-flop is configured to load a particular logic value into the buffer chain in response to assertion of a shift-in clock signal derived from the second clock signal; and a plurality of flip-flops each having an input coupled to an output of a corresponding propagation delay element, wherein the plurality of flip-flops are configured to capture the outputs of the propagation delay elements in response to assertion of a capture clock signal derived from the second clock signal, wherein the assertion of the capture clock signal occurs one clock period of the second clock signal subsequent to the assertion of the shift-in clock signal.

18. The system as recited in claim 17, wherein the duty cycle of the PWM pulse is designated by a concatenation of (1) a specified number of cycles of the second clock signal as calculated from the first measurement, and (2) a specified number of propagation delay elements as calculated from the second measurement.

19. The system as recited in claim 18, further comprising pulse generation logic configured to generate the PWM pulse, wherein the pulse generation logic comprises:

circuitry configured to begin generation of the PWM pulse in response to a selected clock edge of the first clock signal;

circuitry configured to continue generation of a first portion of the PWM pulse for a time period equal to a count of the specified number of cycles of the second clock signal;

circuitry configured to continue generation of a second portion of the PWM pulse concatenated to the first portion for a time period equal to passage of a logic value through the specified number of propagation delay elements under control of the second clock signal; and circuitry configured to stop generation of the PWM pulse after generation of the second portion.

20. The system as recited in claim 19, wherein the first and second clock circuits are implemented so that the first and second clock signals are generated independently from each other.

\* \* \* \* \*